(12) United States Patent
Uchida et al.

(10) Patent No.: US 9,984,879 B2
(45) Date of Patent: May 29, 2018

(54) SILICON CARBIDE SEMICONDUCTOR DEVICE AND METHOD FOR MANUFACTURING SAME

(71) Applicant: SUMITOMO ELECTRIC INDUSTRIES, LTD., Osaka (JP)

(72) Inventors: Kosuke Uchida, Osaka (JP); Takeyoshi Masuda, Osaka (JP); Yu Saitoh, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days. days.

(21) Appl. No.: 15/497,544

(22) Filed: Apr. 26, 2017

(65) Prior Publication Data

US 2017/0229305 A1   Aug. 10, 2017

Related U.S. Application Data

(62) Division of application No. 14/768,713, filed as application No. PCT/JP2014/052542 on Feb. 4, 2014, now Pat. No. 9,666,681.

(30) Foreign Application Priority Data

Mar. 19, 2013 (JP) ................................. 2013-056480

(51) Int. Cl.
| | |
|---|---|
| *H01L 21/3205* | (2006.01) |
| *H01L 21/04* | (2006.01) |
| *H01L 29/423* | (2006.01) |
| *H01L 29/16* | (2006.01) |
| *H01L 29/66* | (2006.01) |
| *H01L 29/78* | (2006.01) |
| *H01L 29/51* | (2006.01) |

(52) U.S. Cl.
CPC ........ *H01L 21/049* (2013.01); *H01L 29/1608* (2013.01); *H01L 29/4236* (2013.01); *H01L 29/42368* (2013.01); *H01L 29/513* (2013.01); *H01L 29/66068* (2013.01); *H01L 29/7827* (2013.01)

(58) Field of Classification Search
CPC . H01L 29/4236; H01L 21/045; H01L 21/049; H01L 29/12; H01L 29/1608; H01L 29/66068; H01L 29/78; H01L 29/42368; H01L 29/513; H01L 29/7827
See application file for complete search history.

(56) References Cited

U.S. PATENT DOCUMENTS

2013/0248881 A1* 9/2013 Ariyoshi ............. H01L 29/1608
257/77

* cited by examiner

*Primary Examiner* — Victor A Mandala
*Assistant Examiner* — Colleen E Snow
(74) *Attorney, Agent, or Firm* — IPUSA, PLLC

(57) ABSTRACT

A trench has first to third side surfaces respectively constituted of first to third semiconductor layers. A first side wall portion included in a first insulating film has first to third regions respectively located on the first to third side surfaces. A second insulating film has a second side wall portion located on the first side wall portion.
The second side wall portion has one end and the other end, the one end being connected to the second bottom portion of the second insulating film, the other end being located on one of the first and second regions, the other end being separated from the third region.

4 Claims, 16 Drawing Sheets

SILICON CARBIDE SEMICONDUCTOR DEVICE AND METHOD FOR MANUFACTURING SAME

CROSS-REFERENCE TO RELATED APPLICATION

This application is a divisional application of and claims the benefit of priority under 35 U.S.C. 120 to patent application Ser. No. 14/768,713 filed on Feb. 4, 2014, which has effectively entered under 35 U.S.C. 371 (c) the national stage on Aug. 18, 2015, from the PCT Application No. PCT/JP2014/052542, which claims priority to Japanese Patent Application No. 2013-056480, filed on Mar. 19, 2013, the contents of which are incorporated herein by reference in their entirety.

TECHNICAL FIELD

The present invention relates to a silicon carbide semiconductor device and a method for manufacturing the silicon carbide semiconductor device, in particular, a silicon carbide semiconductor device having a trench and a method for manufacturing the silicon carbide semiconductor device.

BACKGROUND ART

Japanese Patent Laying-Open No. 7-326755 (Patent Document 1) discloses a trench gate type MOSFET (Metal Oxide Semiconductor Field Effect Transistor) employing a silicon carbide substrate. According to this publication, the thickness of a gate thermal oxidation film at the bottom surface of the trench is more than the thickness of the gate thermal oxidation film at the side surface of the trench.

CITATION LIST

Patent Document

PTD 1: Japanese Patent Laying-Open No. 7-326755

SUMMARY OF INVENTION

Technical Problem

It has been desired to attain a smaller gate electrode capacitance in a semiconductor device having a gate electrode. For example, in a MISFET (Metal insulator Semiconductor Field Effect Transistor), it has been desired to attain a smaller capacitance between the gate electrode and the drain electrode as a feedback capacitance. According to the technique described in the above-described publication, the gate electrode capacitance can be made small to some extent by providing a large thickness of a gate insulating film (gate thermal oxidation film) on the bottom surface, but a further smaller gate electrode capacitance is desired.

The present invention has been made to solve the problem described above, and has an object to provide a silicon carbide semiconductor device having a small gate electrode capacitance and a method for manufacturing the silicon carbide semiconductor device.

Solution To Problem

A silicon carbide semiconductor device of the present invention includes a silicon carbide substrate, a gate insulating film, a gate insulating film, and a gate electrode. The silicon carbide substrate includes a first semiconductor layer, a second semiconductor layer, and a third semiconductor layer, the first semiconductor layer having a first conductivity type, the second semiconductor layer being provided on the first semiconductor layer, the second semiconductor layer having a second conductivity type, the third semiconductor layer being provided on the second semiconductor layer, the third semiconductor layer being separated from the first semiconductor layer by the second semiconductor layer, the third semiconductor layer having the first conductivity type. The silicon carbide substrate is provided with a trench. The trench includes a bottom surface and a side wall surface, the bottom surface being constituted of the first semiconductor layer, the side wall surface having first to third side surfaces respectively constituted of the first to third semiconductor layers. The gate insulating film is provided on the trench. The gate insulating film has a first insulating film and a second insulating film, the first insulating film directly covering each of the side wall surface and the bottom surface, the second insulating film being provided on the first insulating film. The first insulating film has a first bottom portion and a first side wall portion, the first bottom portion being located on the bottom surface, the first side wall portion being located on the side wall surface. The first side wall portion has first to third regions respectively located on the first to third side surfaces. The second insulating film has a second bottom portion and a second side wall portion, the second bottom portion being located on the first bottom portion, the second side wall portion being located on the first side wall portion. The second side wall portion has one end and an other end, the one end being connected to the second bottom portion, the other end being located on one of the first and second regions, the other end being separated from the third region. The gate electrode is provided on the trench with the gate insulating film being interposed therebetween.

A method for manufacturing a silicon carbide semiconductor device in the present invention has the following steps.

There is prepared a silicon carbide substrate including a first semiconductor layer, a second semiconductor layer, and a third semiconductor layer, the first semiconductor layer having a first conductivity type, the second semiconductor layer being provided on the first semiconductor layer, the second semiconductor layer having a second conductivity type, the third semiconductor layer being provided on the second semiconductor layer, the third semiconductor layer being separated from the first semiconductor layer by the second semiconductor layer, the third semiconductor layer having the first conductivity type.

A trench is formed in the silicon carbide substrate. The trench includes a bottom surface and a side wall surface, the bottom surface being constituted of the first semiconductor layer, the side wall surface having first to third side surfaces respectively constituted of the first to third semiconductor layers.

A first insulating film is formed to directly cover each of the side wall surface and the bottom surface. The first insulating film has a first bottom portion and a first side wall portion, the first bottom portion being located on the bottom surface, the first side wall portion being located on the side wall surface. The first side wall portion has first to third regions respectively located on the first to third side surfaces.

A silicon film is formed on the first insulating film. The silicon film has a second bottom portion and a second side wall portion, the second bottom portion being located on the first bottom portion, the second side wall portion being located on the first side wall portion. The second side wall portion has one end and an other end, the one end being connected to the second bottom portion, the other end being located on one of the first and second regions, the other end being separated from the third region.

A second insulating film is formed by oxidizing the silicon film. The first and second insulating films constitutes a gate insulating film.

A gate electrode is formed on the trench with the gate insulating film being interposed therebetween.

Advantageous Effects Of Invention

According to the present invention, the gate electrode capacitance can be made small.

DESCRIPTION OF EMBODIMENTS

Figure 1:
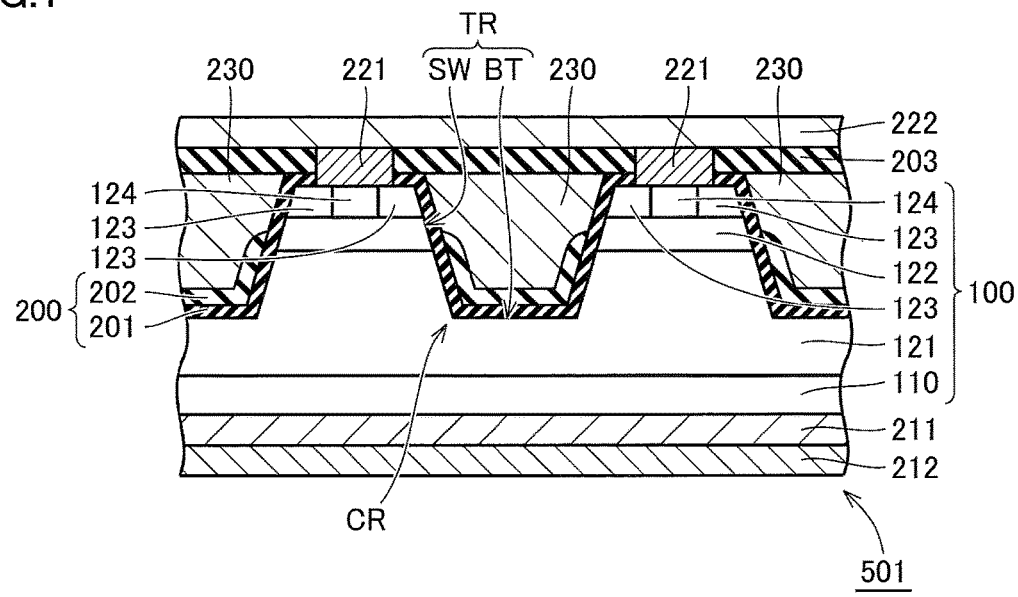
FIG. 1 is a partial cross sectional view schematically showing a configuration of a silicon carbide semiconductor device in a first embodiment of the present invention.

First, the following describes the overview of embodiments with regard to (i) to (xiii) below.

(i) Each of silicon carbide semiconductor devices 501 to 503 has a silicon carbide substrate 100, a gate insulating film 200, and a gate electrode 230. Silicon carbide substrate 100 includes a first semiconductor layer 121, a second semiconductor layer 122, and a third semiconductor layer 123, first semiconductor layer 121 having a first conductivity type, second semiconductor layer 122 being provided on first semiconductor layer 121, second semiconductor layer 122 having a second conductivity type, third semiconductor layer 123 being provided on second semiconductor layer 122, third semiconductor layer 123 being separated from first semiconductor layer 121 by second semiconductor layer 122, third semiconductor layer 123 having the first conductivity type. Silicon carbide substrate 100 is provided with a trench TR. Trench TR includes a bottom surface BT and a side wall surface SW, bottom surface BT being constituted of first semiconductor layer 121, side wall surface SW having first to third side surfaces SW1 to SW3 respectively constituted of first to third semiconductor layers 121 to 123. Gate insulating film 200 is provided on trench TR. Gate insulating film 200 has a first insulating film 201 and a second insulating film 202, first insulating film 201 directly covering each of side wall surface SW and bottom surface BT, second insulating film 202 being provided on first insulating film 201. First insulating film 201 has a first bottom portion 201B and a first side wall portion 201S, first bottom portion 201B being located on bottom surface BT, first side wall portion 201S being located on side wall surface SW. First side wall portion 201S has first to third regions 201a to 201c respectively located on first to third side surfaces SW1 to SW3. Second insulating film 202 has a second bottom portion 202B and a second side wall portion 202S, second bottom portion 202B being located on first bottom portion 201B, second side wall portion 202S being located on first side wall portion 201S. Second side wall portion 202S has one end E1 and an other end E2, one end E1 being connected to second bottom portion 202B, the other end E2 being located on one of first and second regions 201a, 201b, the other end E2 being separated from third region 201c. Gate electrode 230 is provided on trench TR with gate insulating film 200 being interposed therebetween.

According to each of silicon carbide semiconductor devices 501 to 503, second insulating film 202 constituting gate insulating film 200 together with first insulating film 201 is provided not only on first bottom portion 201B of first insulating film 201 but also on first side wall portion 201S of first insulating film 201. Accordingly, gate insulating film 200 has a larger thickness not only on bottom surface BT of trench TR but also on side wall surface SW constituting corner portion CR near bottom surface BT together with bottom surface BT. Therefore, the gate electrode capacitance can be made smaller than that in the case where gate insulating film 200 is made thick only on bottom surface BT of the trench.

(ii) In (i), the other end E2 of second side wall portion 202S may be located on a boundary between first region 201a and second region 201b.

Accordingly, second side wall portion 202S is extended at maximum to such an extent that it does not overlap with second region 201b constituting the channel surface. Therefore, the gate electrode capacitance can be reduced effectively to such an extent that the channel characteristic is hardly influenced.

(iii) In (i), the other end E2 of second side wall portion 202S may be separated from second region 201b and may be located on first region 201a.

Accordingly, second side wall portion 202S is extended to such an extent that it is not close to second region 201b constituting the channel surface. Therefore, the gate electrode capacitance can be reduced to such an extent that the channel characteristic is not influenced.

(iv) In (i), the other end E2 of second side wall portion 202S may be separated from third region 201c and may be located on second region 201b.

Accordingly, second side wall portion 202S is extended more as compared with a case where second side wall portion 202S is provided only on first region 201a. Moreover, second side wall portion 202S is provided to be separated from the boundary, which has a large influence on the channel characteristic, between second region 201b and third region 201c. Therefore, while suppressing the influence on the channel characteristic, the gate electrode capacitance can be reduced more effectively.

(v) In (iv), second semiconductor layer 122 may have a depth position DP in which an impurity concentration has a peak, and the other end E2 of second side wall portion 202S may be located deeper than depth position DP.

Accordingly, second side wall portion 202S is extended more as compared with a case where second side wall portion 202S is provided only on first region 201a. Moreover, second side wall portion 202S is provided to be separated from depth position DP having a large influence on the channel characteristic. Therefore, while further suppressing the influence on the channel characteristic, the gate electrode capacitance can be reduced more effectively.

(vi) In (i) to (v), the other end E2 of second side wall portion 202S may have an inclination angle AG of less than 70° relative to first side wall portion 201S.

Accordingly, a change in thickness of gate insulating film 200 at the other end E2 is reduced.

(vii) In (i) to (vi), first and second insulating films 201, 202 may respectively have first and second carbon atom concentrations, and the second carbon atom concentration may be less than the first carbon atom concentration.

Accordingly, second insulating film 202 has a high dielectric breakdown resistance due to the low carbon atom concentration. Therefore, each of silicon carbide semiconductor devices 501 to 503 has a large breakdown voltage.

(viii) In (vii), the first carbon atom concentration may be more than $1\times10^{15}$ $cm^{-3}$ and the second carbon atom concentration may be less that $1\times10^{15}$ $cm^{-3}$.

Accordingly, the carbon atom concentration of second insulating film 202 is made sufficiently low. Therefore, the breakdown voltage of each of silicon carbide semiconductor devices 501 to 503 can be more increased.

(ix) In (i) to (xiii), second insulating film 202 may be made of at least one of silicon oxide, silicon nitride and phosphosilicate glass.

Accordingly, the breakdown voltage of each of silicon carbide semiconductor devices 501 to 503 can be increased more.

(x) In (i) to (ix), second insulating film 202 may be a thermal oxidation film of a film including silicon and including no carbon.

Accordingly, the breakdown voltage of each of silicon carbide semiconductor devices 501 to 503 can be increased more.

(xi) A method for manufacturing each of silicon carbide semiconductor devices 501 to 503 has the following steps.

There is prepared a silicon carbide substrate 100 including a first semiconductor layer 121, a second semiconductor layer 122, and a third semiconductor layer 123, first semiconductor layer 121 having a first conductivity type, second semiconductor layer 122 being provided on first semiconductor layer 121, second semiconductor layer 122 having a second conductivity type, third semiconductor layer 123 being provided on second semiconductor layer 122, third semiconductor layer 123 being separated from first semiconductor layer 121 by second semiconductor layer 122, third semiconductor layer 123 having the first conductivity type.

A trench TR is formed in silicon carbide substrate 100. Trench TR includes a bottom surface BT and a side wall surface SW, bottom surface BT being constituted of first semiconductor layer 121, side wall surface SW having first to third side surfaces SW1 to SW3 respectively constituted of first to third semiconductor layers 121 to 123.

A first insulating film 201 is formed to directly cover each of side wall surface SW and bottom surface BT. First insulating film 201 has a first bottom portion 201B and a first side wall portion 201S, first bottom portion 201B being located on bottom surface BT, first side wall portion 201S being located on side wall surface SW. First side wall portion 201S has first to third regions 201a to 201c respectively located on first to third side surfaces SW1 to SW3.

A silicon film 302 is formed on first insulating film 201. Silicon film 302 has a second bottom portion 202B and a second side wall portion 202S, second bottom portion 202B being located on first bottom portion 201B, second side wall portion 202S being located on first side wall portion 201S. Second side wall portion 202S has one end E1 and an other end E2, one end E1 being connected to second bottom portion 202B, the other end E2 being located on one of first and second regions 201a, 201b, the other end E2 being separated from third region 201c.

A second insulating film 202 is formed by oxidizing silicon film 302. First and second insulating films 201, 202 constitute a gate insulating film 200.

A gate electrode 230 is formed on trench TR with gate insulating film 200 being interposed therebetween.

According to the manufacturing method, second insulating film 202 constituting gate insulating film 200 together with first insulating film 201 is provided not only on first bottom portion 201B of first insulating film 201 but also on first side wall portion 201S of first insulating film 201. Accordingly, gate insulating film 200 has a larger thickness not only on bottom surface BT of the trench but also on side wall surface SW constituting corner portion CR near bottom surface BT together with bottom surface BT. Therefore, the gate electrode capacitance can be made smaller than that in the case where gate insulating film 200 is made thick only on bottom surface BT of the trench.

(xii) In (xi), the step of forming second insulating film 202 by oxidizing silicon film 302 may be performed at not less than 800° C. and not more than 1150° C.

By oxidizing silicon film 302 at not less than 800° C., the surface roughness of silicon film 302 can be suppressed. Moreover, by oxidizing the silicon film at not more than 1150° C., it is possible to suppress increase of vapor pressure of second insulating film 202 made of silicon dioxide and formed by oxidization of silicon film 302. As a result, the shape of second insulating film 202 can be maintained.

(xiii) In (xi), the step of forming second insulating film 202 may include a step of heating second side wall portion 202S to reduce an angle AG of the other end E2 of second side wall portion 202S relative to first side wall portion 201S.

Accordingly, a change in thickness of gate insulating film 200 at the other end E2 is reduced.

(xiv) In (xiii), the step of heating second side wall portion 202S may be performed at not less than 1300° C. and not more than 1400° C.

Accordingly, angle AG of the other end E2 can be made sufficiently small without employing too high a temperature.

Next, for more detailed description of the embodiments of the invention of the present application, the following describes first to third embodiments as well as supplementary matters. Regarding crystallographic indications in the present specification, an individual orientation is represented by [ ], a group orientation is represented by < >, and an individual plane is represented by ( ) and a group plane is represented by { }. In addition, a negative crystallographic index is normally expressed by putting "–" (bar) above a numeral, but is expressed by putting the negative sign before the numeral in the present specification.

First Embodiment

As shown in FIG. 1, a vertical type MOSFET 501 (silicon carbide semiconductor device) of the present embodiment includes an epitaxial substrate 100 (silicon carbide substrate), gate insulating films 200, gate electrodes 230, interlayer insulating films 203, source electrodes 221, a drain electrode 211, a source interconnection 222, and a protecting electrode 212.

Epitaxial substrate 100 is made of silicon carbide, and has a single-crystal substrate 110 and an epitaxial layer provided thereon. Single-crystal substrate 110 has n type conductivity (first conductivity type). The plane orientation (hklm) of one main surface (upper surface in FIG. 1) of single-crystal substrate 110 preferably has m of negative value, more preferably, is approximately a (000-1) plane. The epitaxial layer includes an n$^-$ layer 121 (first semiconductor layer), p type body layers 122 (second semiconductor layer), n regions 123 (third semiconductor layer), and contact regions 124. The silicon carbide of epitaxial substrate 100 preferably has a hexagonal crystal structure, more preferably, has polytype of 4H. N$^-$ layer 121 has a donor added therein, and therefore has n type conductivity. The donor is preferably added to n$^-$ layer 121 by adding an impurity during epitaxial growth of n$^{31}$ layer 121, rather than ion implantation. N$^-$ layer 121 preferably has a donor concentration lower than that of single-crystal substrate 110. N$^-$ layer 121 preferably has a donor concentration of not less than $1\times10^{15}$ cm$^{-3}$ and not more than $5\times10^{15}$ cm$^{-3}$, for example, $8\times10^{15}$ cm$^{-3}$. Each of p type body layers 122 is provided on n$^-$ layer 121, has an acceptor added therein, and therefore has p type conductivity (second conductivity type). P type body layer 122 has an acceptor concentration of, for example, $1\times10^{18}$ cm$^{-3}$. N region 123 has n type conductivity. N region 123 is provided on p type body layer 122, and is separated from n$^-$ layer 121 by p type body layer 122. Contact region 124 has p type. Contact region 124 is formed on a portion of p type body layer 122 so as to be connected to p type body layer 122.

Figure 2:
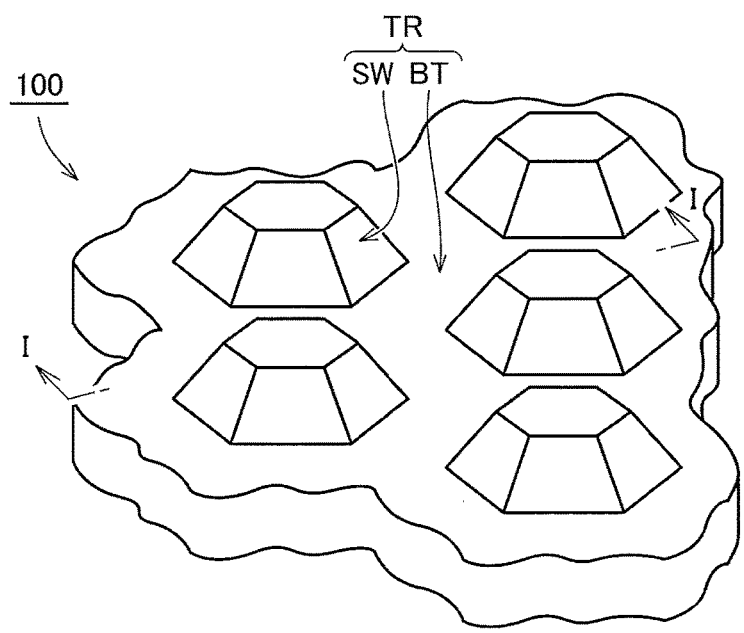
FIG. 2 is a perspective view schematically showing a shape of a silicon carbide substrate included in the silicon carbide semiconductor device of FIG. 1.
Figure 3:
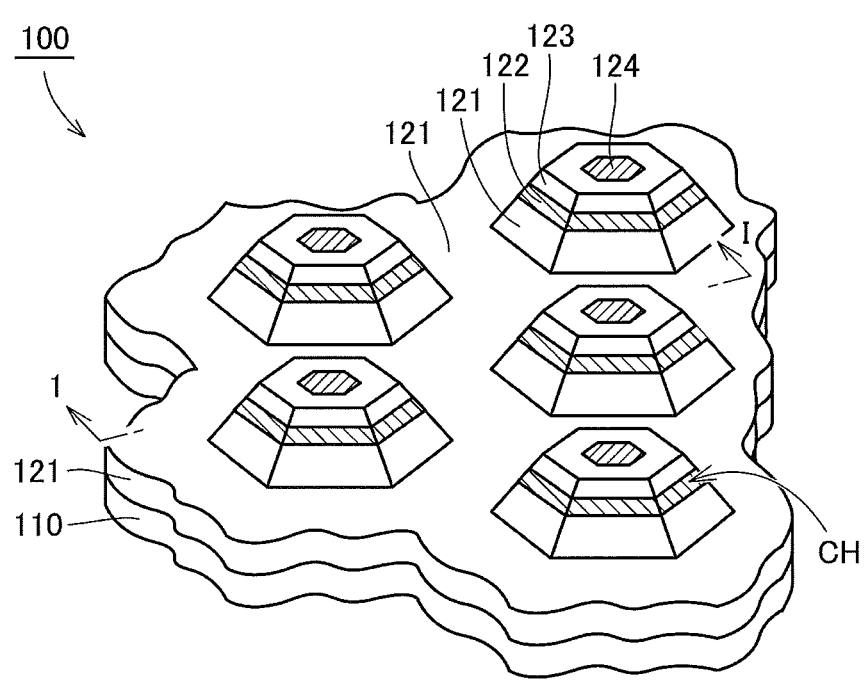
FIG. 3 shows the configuration of FIG. 2 more in detail with hatching being provided for a region of second conductivity type for the purpose of viewability of the figure.

Referring to FIG. 2 and FIG. 3, epitaxial substrate 100 is provided with a trench TR. Trench TR has side wall surfaces SW and a bottom surface BT. Each of side wall surfaces SW extends through n region 123 and p type body layer 122 and reaches n_ layer 121. Bottom surface BT is constituted of n$^-$ layer 121. Each of side wall surfaces SW has a channel surface CH (FIG. 3) on p type body layer 122. Bottom surface BT is a flat surface substantially parallel to the main surface of epitaxial substrate 100. The fact that epitaxial substrate 100 has trench TR corresponds to such a fact that the epitaxial layer is partially removed above the upper surface of single-crystal substrate 110. In the present embodiment, a multiplicity of mesa structures are formed on the upper surface of single-crystal substrate 110. Specifically, each of the mesa structures has upper surface and bottom surface both having a hexagonal shape, and has side walls inclined relative to the upper surface of single-crystal substrate 110. Accordingly, trench TR is expanded toward the opening side. Preferably, side wall surface SW has a predetermined crystal plane (also referred to as "special plane") particularly on p type body layer 122. Details of the special plane will be described later.

Figure 4:
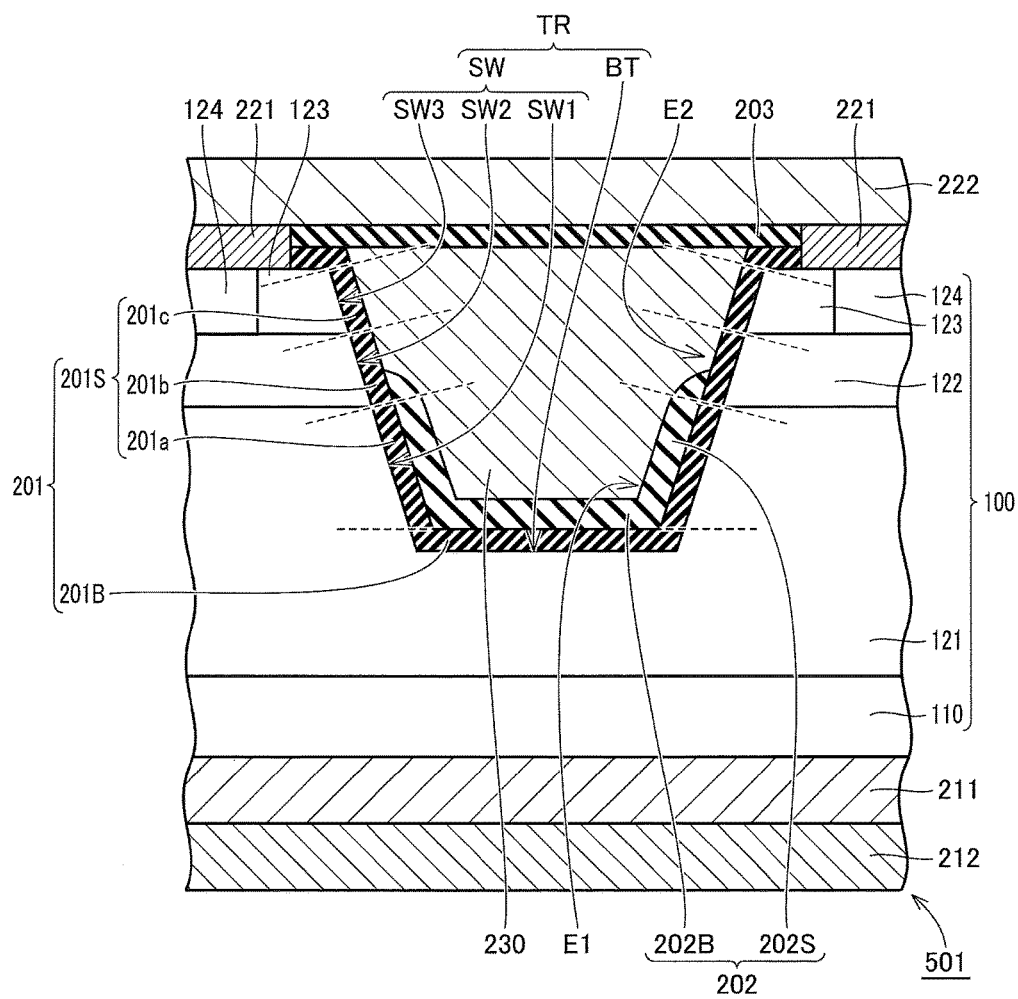
FIG. 4 is an enlarged view of FIG. 1 to particularly illustrate a component of a first insulating film.

Further, with reference to FIG. 4, side wall surface SW has first to third side surfaces SW1 to SW3 respectively constituted of n$^-$ layer 121, p type body layer 122, and n region 123.

Gate insulating film 200 is provided on trench TR. Gate insulating film 200 separates epitaxial substrate 100 and gate electrode 230 from each other in trench TR. Gate insulating film 200 includes: a first insulating film 201 directly covering each of side wall surface SW and bottom surface BT; and a second insulating film 202 provided on first insulating film 201. First and second insulating films 201, 202 respectively have first and second carbon atom concentrations. The second carbon atom concentration may be smaller than the first carbon atom concentration. The first carbon atom concentration may be more than $1-10^{15}$ cm$^{-3}$. The second carbon atom concentration may be less than $1\times10^{15}$ cm$^{-3}$, and the concentration may be substantially zero.

First insulating film 201 includes: a first bottom portion 201B located on bottom surface BT; and a first side wall portion 201S located on side wall surface SW. First side wall portion 201S has first to third regions 201a to 201c respectively located on first to third side surfaces SW1 to SW3. First insulating film 201 is preferably an oxide film, and is more preferably obtained by thermally oxidizing the surface of trench TR of epitaxial substrate 100.

Figure 5:
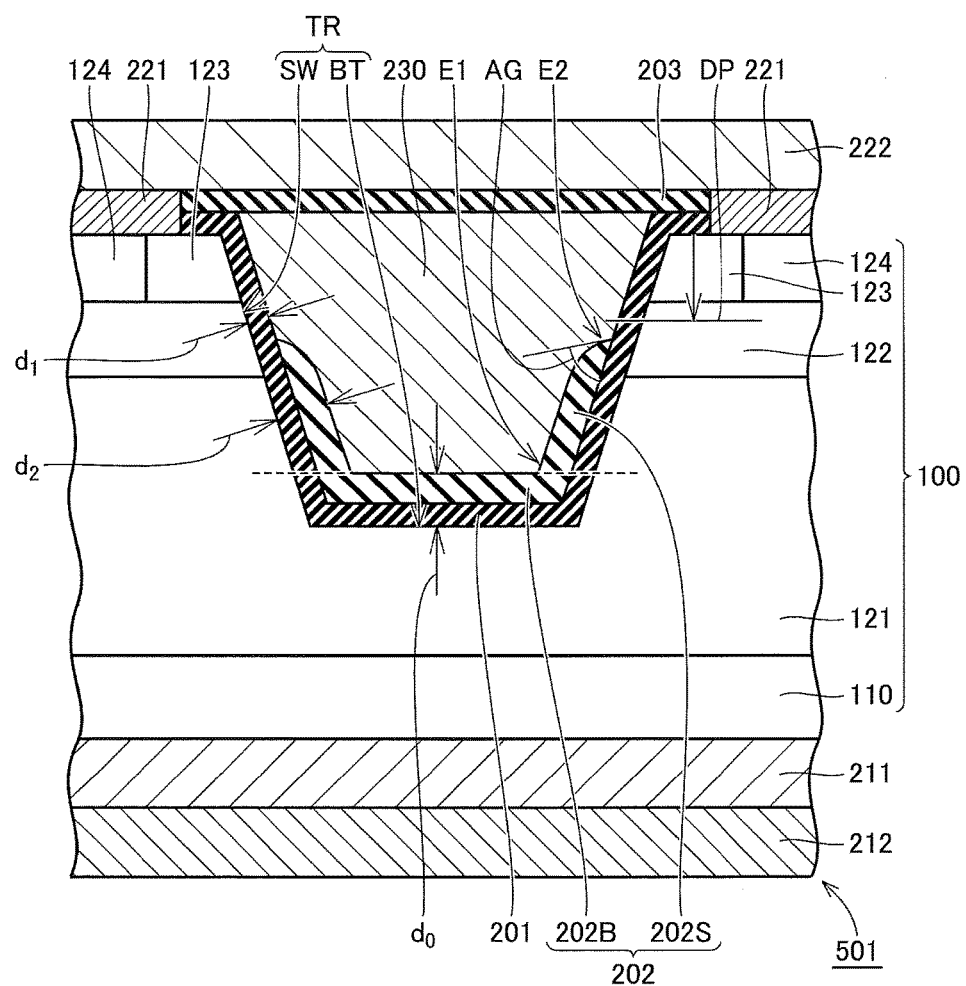
FIG. 5 is an enlarged view of FIG. 1 to particularly illustrate the size of a gate insulating film.

Further, with reference to FIG. 5, second insulating film 202 has a portion located on a corner portion CR (FIG. 1) formed by bottom surface BT and side wall surface SW with first insulating film 201 interposed therebetween. Specifically, second insulating film 202 includes: a second bottom portion 202B located on first bottom portion 201B; and a second side wall portion 202S located on first side wall portion 201S. Second side wall portion 202S includes: one end E1 connected to second bottom portion 202B; and the other end E2 located on one of first and second regions 201a, 201b (FIG. 4) and separated from the third region. In the present embodiment, the other end E2 is separated from third region 201c and is located on second region 201b. The other end E2 has an inclination angle AG (FIG. 5) relative to first side wall portion 201S. Inclination angle AG is an angle formed by a tip portion of the surface of the other end E2 and a portion of the surface of first side wall portion 201S in contact with the other end E2. Inclination angle AG is preferably less than 70°. Second semiconductor layer 122 may have a depth position DP (FIG. 5) at which the impurity concentration has a peak, and in this case, the other end E2 is preferably located deeper than depth position DP. Second insulating film 202 may be made of at least one of silicon oxide, silicon nitride and phosphosilicate glass. Second insulating film 202 may be a thermal oxidation film of a film including silicon and including no carbon, for example, is made of $SiO_2$.

Gate insulating film 200 includes a portion having first and second insulating films 201, 202 on bottom surface BT of trench TR, and this portion has a thickness $d_0$. Moreover, gate insulating film 200 has a portion having first insulating film 201 and having no second insulating film 202 on side wall surface SW of trench TR, i.e., has a portion constituted of only first insulating film 201, and this portion has a thickness $d_1$. Moreover, gate insulating film 200 has a portion having first and second insulating films 201, 202 on first side surface SW1 of side wall surface SW of trench TR, and this portion has a thickness $d_2$. Preferably, $d_2 > d_1 \times 1.5$ is satisfied. Preferably, $d_2 < d_1 \times 5$ is satisfied. Preferably, $d_0 > d_1$ is satisfied. Preferably, $d_0 > d_2$ is satisfied.

Gate electrode 230 is provided in trench TR. Specifically, gate electrode 230 is provided on trench TR with gate insulating film 200 being interposed therebetween. Gate electrode 230 is in contact with second region 201b of first insulating film 201. Gate electrode 230 has an upper surface substantially as high as the upper surface of a portion of gate insulating film 200 on the upper surface of n region 123. Interlayer insulating film 203 is provided to cover gate electrode 230 and cover gate insulating film 200 at its portion extending onto the upper surface of n region 123.

Source electrode 221 extends through interlayer insulating film 203 and is in contact with each of n region 123 and contact region 124. Source interconnection 222 is provided on source electrode 221 and interlayer insulating film 203 in contact with source electrode 221. Drain electrode 211 is provided on an opposite surface of epitaxial substrate 100 to its surface provided with trench TR. Protecting electrode 212 covers drain electrode 211.

Next, the following describes a method for manufacturing MOSFET 501 (FIG. 1).

Figure 6:
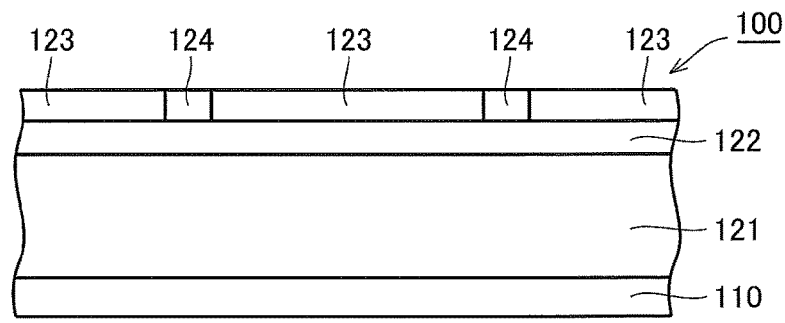
FIG. 6 is a partial cross sectional view schematically showing a first step of a method for manufacturing the silicon carbide semiconductor device of FIG. 1.

As shown in FIG. 6, on single-crystal substrate 110, n$^-$ layer 121 is formed by means of epitaxial growth. This epitaxial growth can be achieved by employing a CVD (Chemical Vapor Deposition) method that utilizes a mixed gas of silane ($SiH_4$) and propane ($C_3H_8$) as a material gas and utilizes hydrogen gas ($H_2$) as a carrier gas, for example. In doing so, it is preferable to introduce nitrogen (N) or phosphorus (P) as a donor, for example. Next, p type body layer 122 is formed on n$^-$ layer 121, and n region 123 is formed on p type body layer 122. Specifically, ions are implanted into the upper surface of n$^-$ layer 121. In the ion implantation for forming p type body layer 122, ions of an acceptor such as aluminum (Al) are implanted. Meanwhile, in the ion implantation for forming n region 123, ions of a donor such as phosphorus (P) are implanted, for example. In this way, epitaxial substrate 100 is formed which has n$^-$ layer 121, p type body layer 122, and n region 123. It should be noted that instead of the ion implantation, epitaxial growth involving addition of an impurity may be employed. Next, contact region 124 is formed by ion implantation. Next, an activation heating treatment is performed to activate the impurities added by the ion implantation. This heat treatment is preferably performed at a temperature of not less than 1500° C. and not more than 1900° C., for example, a temperature of approximately 1700° C. The heat treatment is performed for approximately 30 minutes, for example. The atmosphere of the heat treatment is preferably an inert gas atmosphere, such as Ar atmosphere. In this way, silicon carbide substrate 100 is prepared.

Figure 7:
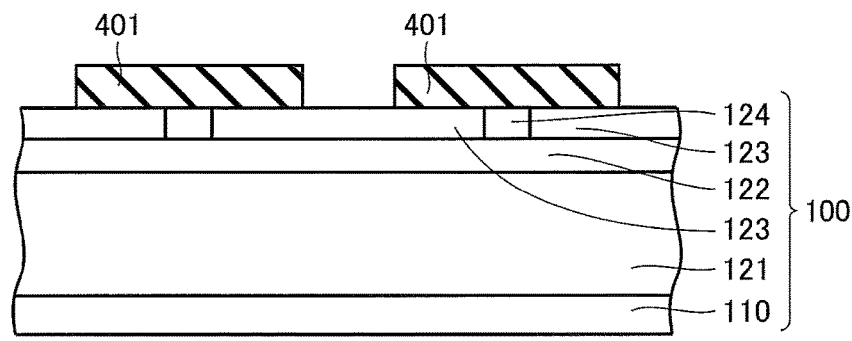
FIG. 7 is a partial cross sectional view schematically showing a second step of the method for manufacturing the silicon carbide semiconductor device of FIG. 1.

As shown in FIG. 7, a mask 401 having an opening to partially expose n region 123 is formed on epitaxial substrate 100. The opening is formed in conformity with the position of trench TR (FIG. 1). As mask 401, a silicon oxide film formed by thermal oxidation can be used, for example.

Figure 8:
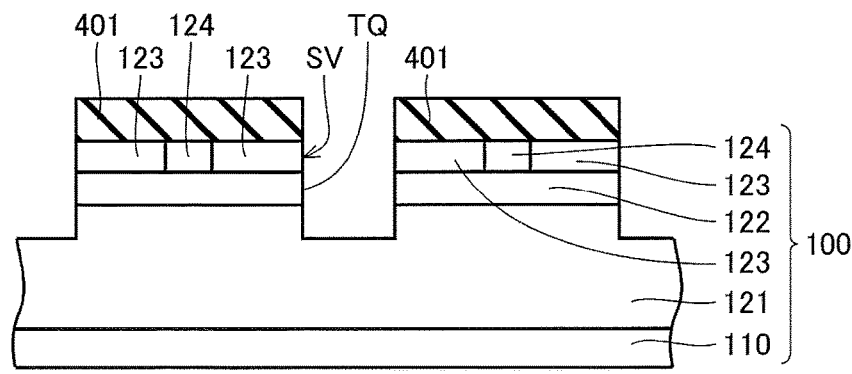
FIG. 8 is a partial cross sectional view schematically showing a third step of the method for manufacturing the silicon carbide semiconductor device of FIG. 1.

As shown in FIG. 8, in the opening of mask 401, n region 123, p type body layer 122, and a portion of n$^-$ layer 121 are removed by etching. An exemplary, usable etching method is reactive ion etching (RIE), in particular, inductively coupled plasma (ICP) RIB. Specifically, ICP-RIE can be employed which uses $SF_6$ or a mixed gas of $SF_6$ and $O_2$ as a reactive gas, for example. By means of such etching, in the region where trench TR (FIG. 1) is to be formed, a recess TQ can be formed which has a side wall having an inner surface SV substantially perpendicular to the main surface of single-crystal substrate 110.

Next, epitaxial substrate 100 is etched using mask 401. Specifically, inner surface SV of recess TQ of epitaxial substrate 100 is thermally etched. The thermal etching can be performed by, for example, heating epitaxial substrate 100 in an atmosphere containing a reactive gas having at least one or more types of halogen atom. The at least one or more types of halogen atom include at least one of chlorine (Cl) atom and fluorine (F) atom. This atmosphere is, for example, $Cl_2$, $BCL_3$, $SF_6$, or $CF_4$. For example, the thermal etching is performed using a mixed gas of chlorine gas and oxygen gas as a reactive gas, at a heat treatment temperature of, for example, not less than 700° C. and not more than 1000° C. It should be noted that the reactive gas may contain a carrier gas in addition to the chlorine gas and the oxygen gas. An exemplary, usable carrier gas is nitrogen ($N_2$) gas, argon gas, helium gas, or the like. When the heat treatment temperature is set at not less than 700° C. and not more than 1000° C. as described above, a rate of etching SiC is approximately, for example, 70 μm/hour. In addition, in this case, mask 401, which is formed of silicon oxide and therefore has a very large selection ratio relative to SiC, is not substantially etched during the etching of SiC.

Figure 9:
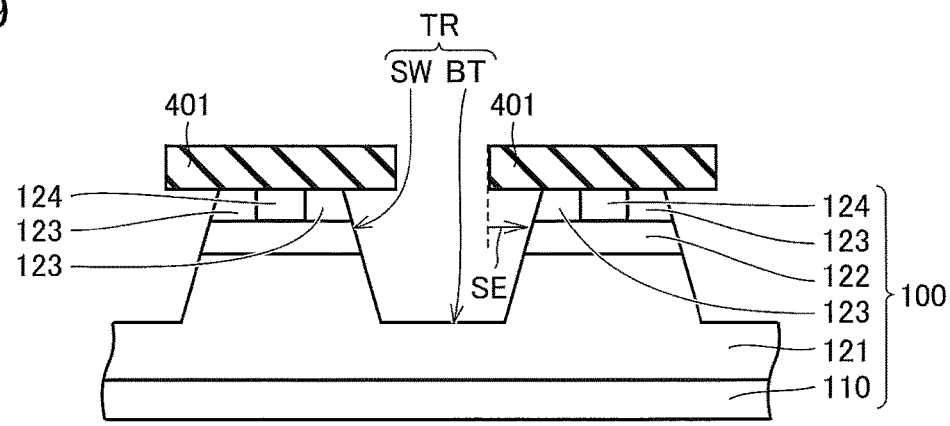
FIG. 9 is a partial cross sectional view schematically showing a fourth step of the method for manufacturing the silicon carbide semiconductor device of FIG. 1.

As shown in FIG. 9, trench TR is formed in silicon carbide substrate 100 by the above-described thermal etching. During the formation of trench TR, epitaxial substrate 100 is side-etched from the opening of mask 401 as indicated by an arrow SE. Further, during this thermal etching, a special plane is spontaneously formed on side wall surface SW of trench TR, in particular, on the portion constituted of p type body layer 122.

Figure 10:
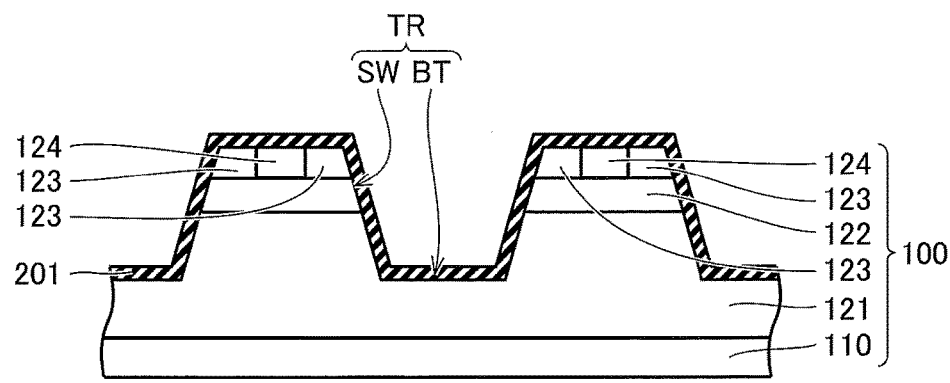
FIG. 10 is a partial cross sectional view schematically showing a fifth step of the method for manufacturing the silicon carbide semiconductor device of FIG. 1.

As shown in FIG. 10, first insulating film 201 is formed to directly cover each of side wall surface SW and bottom surface BT. In other words, first insulating film 201 has a portion directly located on bottom surface BT and a portion directly located on side wall surface SW. First insulating film 201 can be formed by thermal oxidation of bottom surface BT and side wall surface SW of trench TR.

Figure 11:
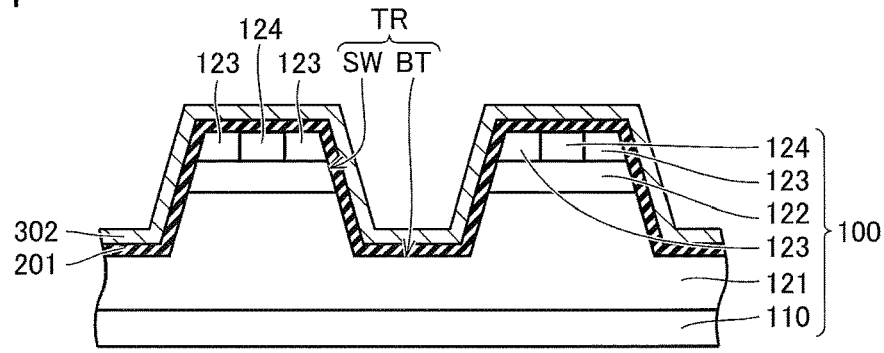
FIG. 11 is a partial cross sectional view schematically showing a sixth step of the method for manufacturing the silicon carbide semiconductor device of FIG. 1.

As shown in FIG. 11, silicon film 302 is formed on first insulating film 201. Silicon film 302 can be formed by, for example, a chemical vapor deposition (CVD) method.

Figure 12:
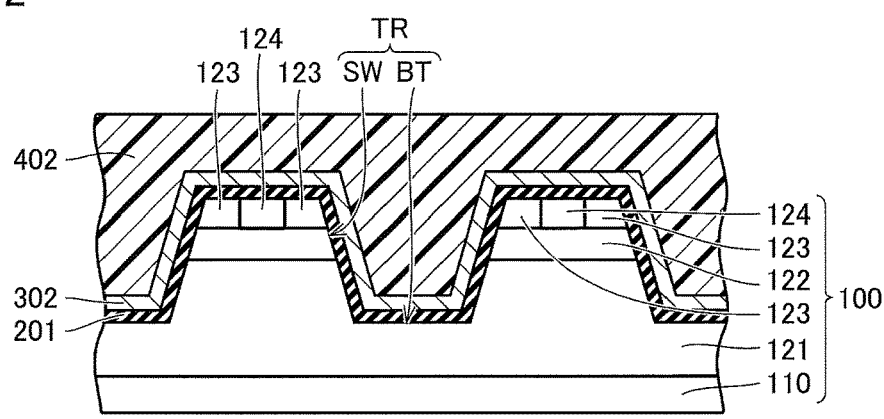
FIG. 12 is a partial cross sectional view schematically showing a seventh step of the method for manufacturing the silicon carbide semiconductor device of FIG. 1.

As shown in FIG. 12, a resist layer 402 is formed on silicon film 302 to fill trench TR with first insulating film 201 and silicon film 302 interposed therebetween. Resist layer 402 can be formed by application of resist liquid. Next, resist layer 402 and a portion of silicon film 302 are etched. This etching can be performed without using an etching mask. That is, the etching may be performed by way of etch back.

Figure 13:
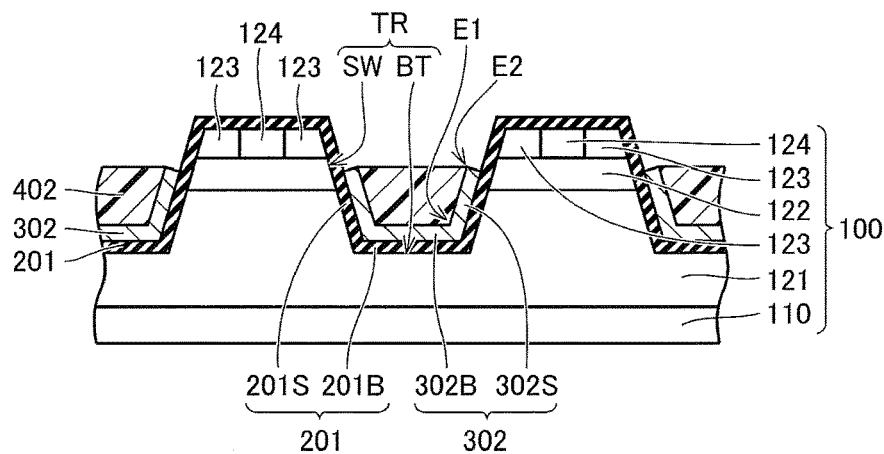
FIG. 13 is a partial cross sectional view schematically showing an eighth step of the method for manufacturing the silicon carbide semiconductor device of FIG. 1.
Figure 14:
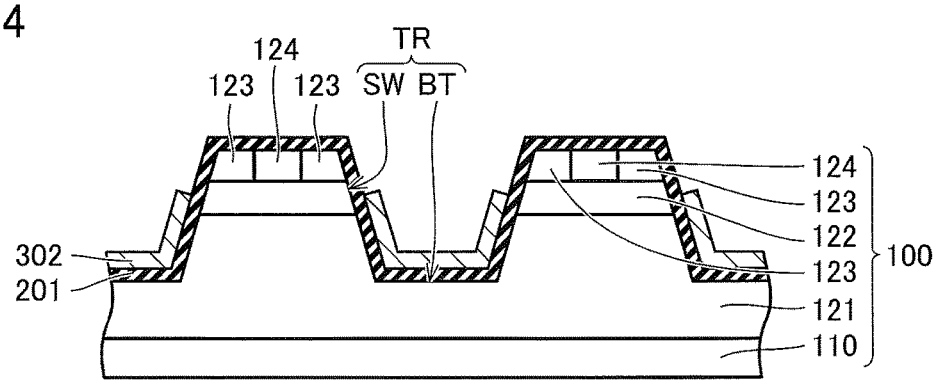
FIG. 14 is a partial cross sectional view schematically showing a ninth step of the method for manufacturing the silicon carbide semiconductor device of FIG. 1.
Figure 15:
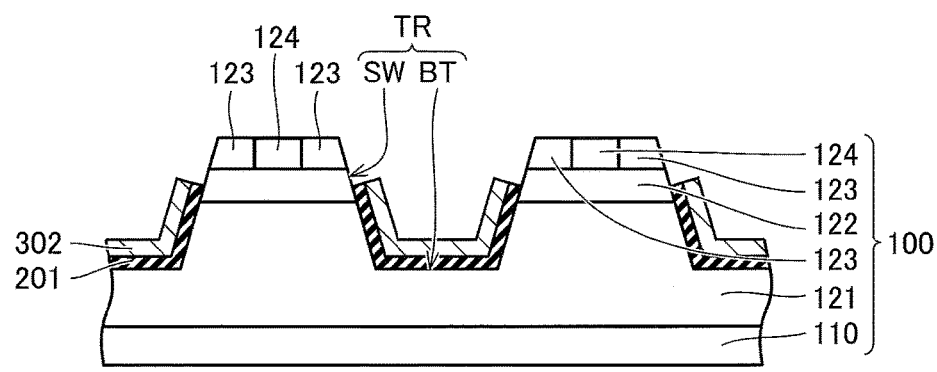
FIG. 15 is a partial cross sectional view schematically showing a tenth step of the method for manufacturing the silicon carbide semiconductor device of FIG. 1.

As shown in FIG. 13, with the above-described etching, resist layer 402 and silicon film 302 remain on bottom surface BT to partially fill trench TR. Silicon film 302 includes: a second bottom portion 302B located on first bottom portion 201B; and a second side wall portion 302S located on first side wall portion 201S. Second side wall portion 302S includes: one end E1 connected to second bottom portion 302B; and the other end E2 located on second region 201b and separated from third region 201c. Next, resist layer 402 is removed (FIG. 14). Next, etching is performed to remove first insulating film 201 at its exposed portion not covered with silicon film 302 (FIG. 15).

Figure 16:
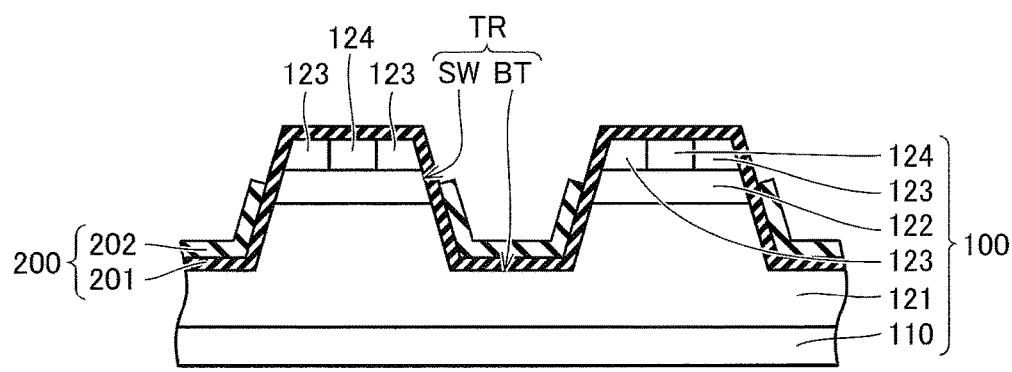
FIG. 16 is a partial cross sectional view schematically showing an eleventh step of the method for manufacturing the silicon carbide semiconductor device of FIG. 1.

Next, trench TR having first insulating film 201 and silicon film 302 provided thereon is thermally oxidized. This results in thermal oxidation of silicon film 302 and the exposed portion of side wall surface SW of trench TR. Silicon film 302 is thermally oxidized at not less than 800° C. and not more than 1150° C., for example. With this thermal oxidation, second insulating film 202 is formed from silicon film 302 (FIG. 16). First and second insulating films 201, 202 constitute gate insulating film 200.

Preferably, silicon film 302 is thermally oxidized at not less than 950° C. and not more than 1100° C., for example. If silicon film 302 is oxidized at a temperature of less than 950° C., it is presumed that stress relaxation resulting from viscous flow of a silicon dioxide film formed by oxidizing silicon film 302 does not work to thereby move silicon near grain boundaries to the surface side, with the result that crystal grain grows at the surface of silicon film 302 to form a projection. The projection can be suppressed from being formed by oxidizing silicon film 302 at not less than 950° C., thereby effectively suppressing surface roughness of second insulating film 202. On the other hand, if silicon film 302 is oxidized at a temperature of more than 1100° C., first insulating film 201 made of silicon dioxide and silicon film 302 cause chemical reaction to form silicon oxide, thus making it difficult to maintain the shape of second insulating film 202. Thus, by oxidizing silicon film 302 at not more than 1100° C., the vapor pressure of silicon oxide is suppressed from being increased, thereby effectively maintaining the shape of second insulating film 202.

Figure 17:
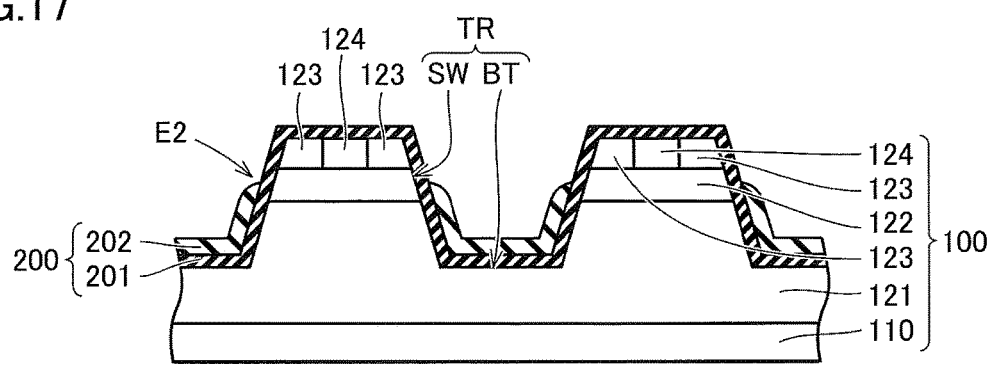
FIG. 17 is a partial cross sectional view schematically showing a twelfth step of the method for manufacturing the silicon carbide semiconductor device of FIG. 1.

As shown in FIG. 17, when forming second insulating film 202, angle AG (FIG. 5) is made small by heating second side wall portion 202S at a sufficient temperature. The temperature of this heating is preferably not less than 1300° C. and not more than 1400° C. By performing this heating in an oxidizing atmosphere, the film thickness of first insulating film 201 can be made thicker.

Figure 18:
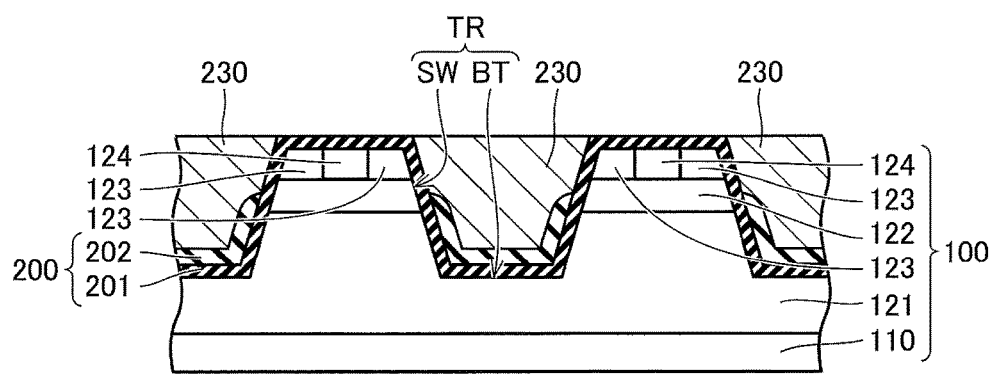
FIG. 18 is a partial cross sectional view schematically showing a thirteenth step of the method for manufacturing the silicon carbide semiconductor device of FIG. 1.

As shown in FIG. 18, gate electrode 230 is formed on trench TR with gate insulating film 200 interposed therebetween. Gate electrode 230 is formed by, for example, forming a film of conductor or doped polysilicon and performing CMP (Chemical Mechanical Polishing).

Referring to FIG. 1 again, interlayer insulating film 203 is formed on gate electrode 230 and gate insulating film 200 so as to cover the exposed surface of gate electrode 230. Etching is performed to form an opening in interlayer insulating film 203 and gate insulating film 200. Through the opening, each of n region 123 and contact region 124 is exposed on the upper surface of the mesa structure. Next, on the upper surface of the mesa structure, source electrode 221 is formed in contact with each of n region 123 and contact region 124. Source interconnection 222, drain electrode 211, and protecting electrode 212 are formed. In this way, MOSFET 501 is obtained.

According to the present embodiment, as shown in FIG. 5, second insulating film 202 constituting gate insulating film 200 together with first insulating film 201 is provided not only on first bottom portion 201B of first insulating film 201 but also on first side wall portion 201S of first insulating film 201. Accordingly, gate insulating film 200 has a larger thickness not only on bottom surface BT of trench TR but also on side wall surface SW constituting corner portion CR near bottom surface BT together with bottom surface BT. Therefore, the gate electrode capacitance can be made smaller than that in the case where gate insulating film 200 is made thick only on bottom surface BT of the trench.

Moreover, when a load connected to MOSFET 501 is short-circuited, a large amount of current flows in a channel surface CH, thereby increasing the temperature of gate insulating film 200. As a result, the insulating property of gate insulating film 200 is decreased to result in flow of leakage current. This leakage current particularly causes a problem in the vicinity of a boundary, in which channel current is concentrated and relatively high voltage is applied to gate insulating film 200, between first and second regions 201a, 201b (FIG. 4). According to the present embodiment, second side wall portion 202S of second insulating film 202 is provided at the portion in which such leakage current is most likely to flow. Accordingly, the leakage current can be suppressed. When channel surface CH (FIG. 3) is of a special plane, the above-mentioned temperature increase becomes noticeable due to the high mobility in channel surface CH, so that it is particularly important to suppress the leakage current.

Moreover, in the vicinity of the boundary, the impurity concentration of p type body layer 122 is made lower than that in depth position DP (FIG. 5) in many cases. In such cases, if the drain voltage is large, a short channel effect is likely to occur. According to the present embodiment, the influence of such a short channel effect can be reduced. Moreover, the short circuit capacity can be improved accordingly.

When $d_2$ is made large to satisfy $d_2 > d_1 \times 1.5$, the above-described advantage can be obtained more sufficiently. Moreover, when $d_2$ becomes too large, the current is blocked from being spread near corner portion CR (FIG. 1) and the on resistance accordingly becomes large, so that $d_2 < d_f \times 5$ is preferably satisfied.

Moreover, as shown in FIG. 4, the other end E2 of second side wall portion 202S is separated from third region 201c and is located on second region 201b. Accordingly, second side wall portion 202S is extended more as compared with a case where second side wall portion 202S is provided only on first region 201a. Moreover, second side wall portion 202S is provided to be separated from the boundary, which has a large influence on the channel characteristic, between second region 201b and third region 201c. Therefore, while suppressing the influence on the channel characteristic, the gate electrode capacitance can be reduced more effectively.

Moreover, preferably, second semiconductor layer 122 has depth position DP (FIG. 5) in which the impurity concentration has a peak, and the other end E2 of second side wall portion 202S is preferably located deeper than depth position DP. Accordingly, second side wall portion 202S is extended more as compared with a case where second side wall portion 202S is provided only on first region 201a. Moreover, second side wall portion 202S is provided to be separated from depth position DP having a large influence on the channel characteristic. Therefore, while further suppressing the influence on the channel characteristic, the gate electrode capacitance can be reduced more effectively.

The other end E2 of second side wall portion 202S preferably has an inclination angle AG of less than 70° relative to first side wall portion 201S. Accordingly, a change in thickness of gate insulating film 200 at the other end E2 is reduced.

First and second insulating films 201, 202 respectively have the first and second carbon atom concentrations, and the second carbon atom concentration is preferably less than the first carbon atom concentration. Accordingly, second insulating film 202 has a high dielectric breakdown resistance due to the low carbon atom concentration. Therefore, silicon carbide semiconductor device 501 has a large breakdown voltage. It should be noted that first insulating film 201 is formed by thermal oxidation of bottom surface BT and side wall surface SW of trench TR made of silicon carbide, and therefore includes many carbon atoms originating from silicon carbide. On the other hand, second insulating film 202 is formed by oxidizing silicon film 302. Therefore, the carbon atom concentration of second insulating film 202 becomes smaller than the carbon atom concentration of first insulating film 201.

The first carbon atom concentration is preferably more than $1 \times 10^{15}$ cm$^{-3}$ and the second carbon atom concentration is less than $1 \times 10^{15}$ cm$^{-3}$. Accordingly, the carbon atom concentration of second insulating film 202 is made sufficiently low. Therefore, the breakdown voltage of silicon carbide semiconductor device 501 can be more increased.

Second insulating film 202 is preferably made of at least one of silicon oxide, silicon nitride and phosphosilicate glass. Accordingly, the breakdown voltage of silicon carbide semiconductor device 501 can be increased more.

Second insulating film 202 is preferably a thermal oxidation film of a film including silicon and including no carbon. Accordingly, the breakdown voltage of silicon carbide semiconductor device 501 can be increased more.

The step of forming second insulating film 202 by oxidizing silicon film 302 is preferably performed at not less than 800° C. and not more than 1150° C. By oxidizing silicon film 302 at not less than 800° C., the surface roughness of silicon film 302 can be suppressed. Moreover, by oxidizing the silicon film at not more than 1150° C., it is possible to suppress increase of vapor pressure of second insulating film 202 made of silicon oxide and formed by oxidization of silicon film 302. As a result, the shape of second insulating film 202 can be maintained.

The step of forming second insulating film 202 preferably includes the step of heating second side wall portion 202S to reduce angle AG of the other end E2 of second side wall portion 202S relative to first side wall portion 201S. Accordingly, a change in thickness of gate insulating film 200 at the other end E2 is reduced. This step is preferably performed at not less than 1300° C. and not more than 1400° C. Accordingly, angle AG of the other end E2 can be made sufficiently small without employing too high a temperature.

It should be noted that the method of employing the thermal oxidation of the silicon film has been illustrated as a method of forming second insulating film 202 in the present embodiment; however, second insulating film 202 may be formed by a deposition method or may be directly formed by the CVD method, for example. Moreover, it is assumed that the "first conductivity type" is n type, and the "second conductivity type" is p type, but these conductivity types may be replaced with each other. In this case, the donor and the acceptor in the above description are also replaced with each other. It should be noted that in order to attain higher channel mobility, the "first conductivity type" is preferably n type. Further, the silicon carbide semiconductor device is not limited to the MOSFET, and may be, for example, a trench type IGBT (Insulated Gate Bipolar Transistor).

Second Embodiment

Figure 19:
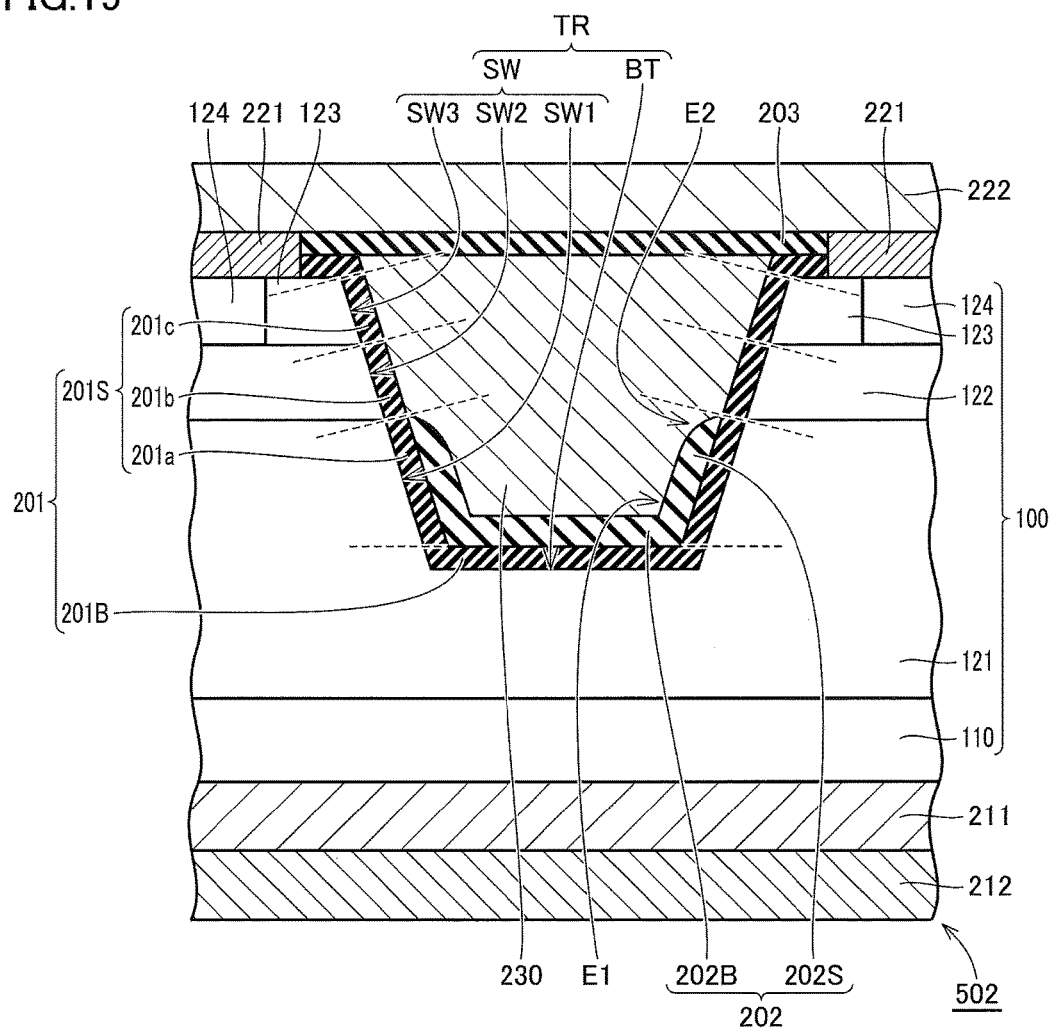
FIG. 19 is a partial cross sectional view schematically showing a configuration of a silicon carbide semiconductor device in a second embodiment of the present invention.

As shown in FIG. 19, in a MOSFET 502 (silicon carbide semiconductor device) of the present embodiment, the other end E2 of second side wall portion 202S of second insulating film 202 is located on a boundary between first region 201a and second region 201b. The expression "located on the boundary" herein is intended to permit an error to such an extent that each of the gate electrode capacitance and the channel characteristic is kept to be substantially the same degree. Specifically, an error of about ±0.1 μm is permitted. Such a second side wall portion 202S can be obtained by, for example, further advancing the etch back process (FIG. 13) in the first embodiment such that the other end E2 of second side wall portion 302S of silicon film 302 coincides with the vicinity of the above-mentioned boundary. It should be noted that configurations other than the above are substantially the same as those of the first embodiment. Hence, the same or corresponding elements are given the same reference characters and are not described repeatedly.

According to the present embodiment, second side wall portion 202S is extended at maximum to such an extent that it does not overlap with second region 201b constituting the channel surface. Therefore, the gate electrode capacitance can be reduced effectively to such an extent that the channel characteristic is hardly influenced.

Third Embodiment

Figure 20:
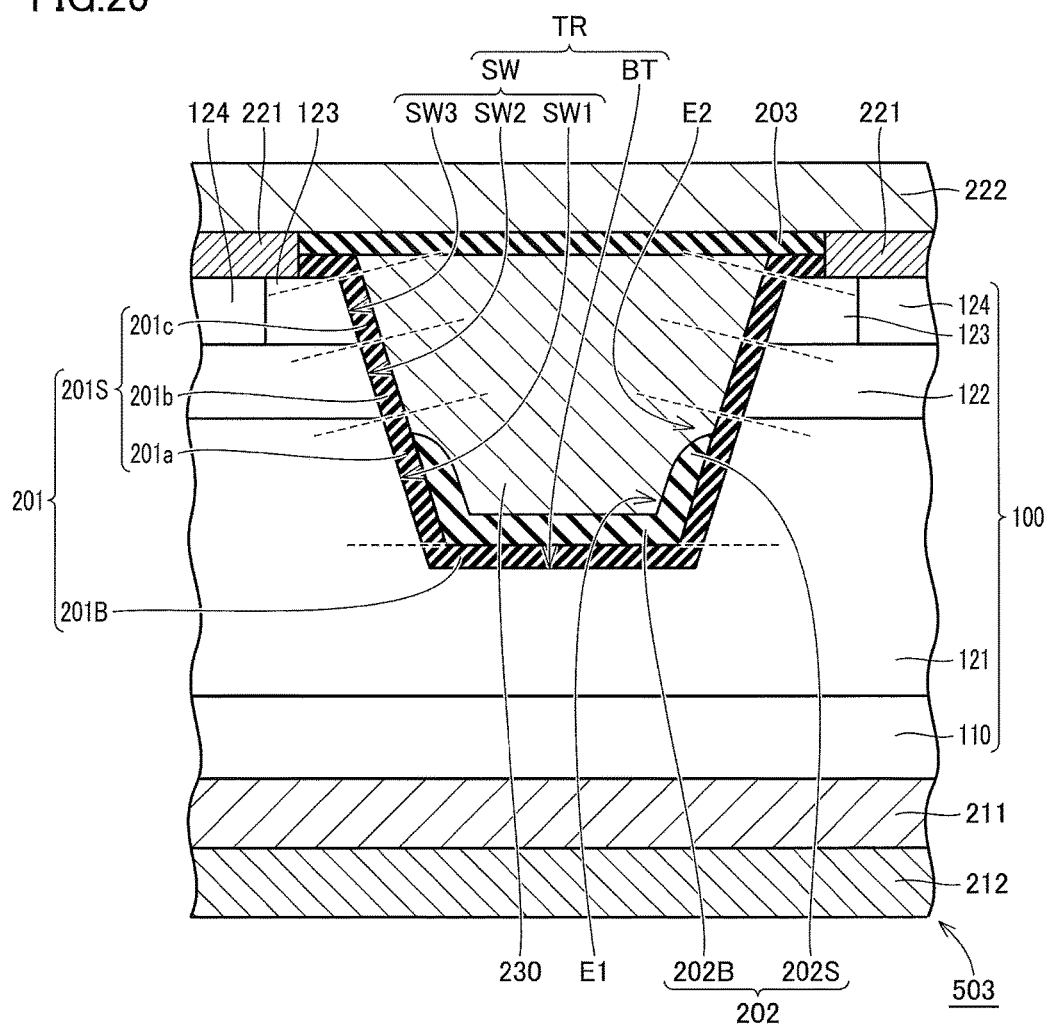
FIG. 20 is a partial cross sectional view schematically showing a configuration of a silicon carbide semiconductor device in a third embodiment of the present invention.

As shown in FIG. 20, in a MOSFET 503 (silicon carbide semiconductor device) of the present embodiment, the other end E2 of second side wall portion 202S of second insulating film 202 is separated from second region 201b and is located on first region 201a. Preferably, the other end E2 is separated from second region 201b by more than 0.1 µm. Such a second side wall portion 202S can be obtained by, for example, further advancing the etch back process (FIG. 13) in the first embodiment such that the other end E2 of second side wall portion 302S of silicon film 302 is separated from second region 201b and is located on first region 201a. It should be noted that configurations other than the above are substantially the same as those of the first embodiment. Hence, the same or corresponding elements are given the same reference characters and are not described repeatedly.

According to the present embodiment, second side wall portion 202S is extended to such an extent that it is not close to second region 201b constituting the channel surface. Therefore, the gate electrode capacitance can be reduced to such an extent that the channel characteristic is not influenced.

(Surface Having Special Plane)

Figure 21:
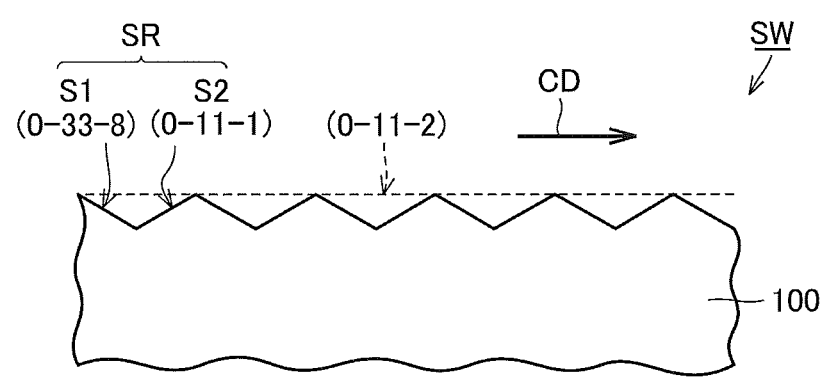
FIG. 21 is a partial cross sectional view schematically showing a fine structure in a surface of a silicon carbide substrate included in the silicon carbide semiconductor device.

As described above, side wall surface SW (FIG. 1) of trench TR preferably has the predetermined crystal plane (also referred to as "special plane") particularly on p type body layer 122. Such a side wall surface SW includes a plane S1 (first plane) having a plane orientation of {0-33-8} as shown in FIG. 21. Plane S1 preferably has a plane orientation of (0-33-8).

More preferably, side wall surface SW includes plane S1 microscopically, and side wall surface SW further includes a plane S2 (second plane) having a plane orientation of {0-11-1}, microscopically. Here, the term "microscopically" refers to "minutely to such an extent that at least the size about twice as large as an interatomic spacing is considered". As a method for observing such a microscopic structure, for example, a TEM (Transmission Electron Microscope) can be used. Plane S2 preferably has a plane orientation of (0-11-1).

Preferably, plane S1 and plane S2 of side wall surface SW form a combined plane SR having a plane orientation of {0-11-2}. Specifically, combined plane SR is formed of periodically repeated planes S1 and S2. Such a periodic structure can be observed by, for example, TEM or AFM (Atomic Force Microscopy). In this case, combined plane SR has an off angle of 62° relative to the {000-1} plane, macroscopically. Here, the term "macroscopically" refers to "disregarding a fine structure having a size of approximately interatomic spacing". For the measurement of such a macroscopic off angle, a method employing general X-ray diffraction can be used, for example. Preferably, combined plane SR has a plane orientation of (0-11-2). In this case, combined plane SR has an off angle of 62° relative to the (000-1) plane, macroscopically.

Preferably, in the channel surface, carriers flow in a channel direction CD, in which the above-described periodic repetition is done.

Next, a detailed structure of combined plane SR will be illustrated.

Figure 22:
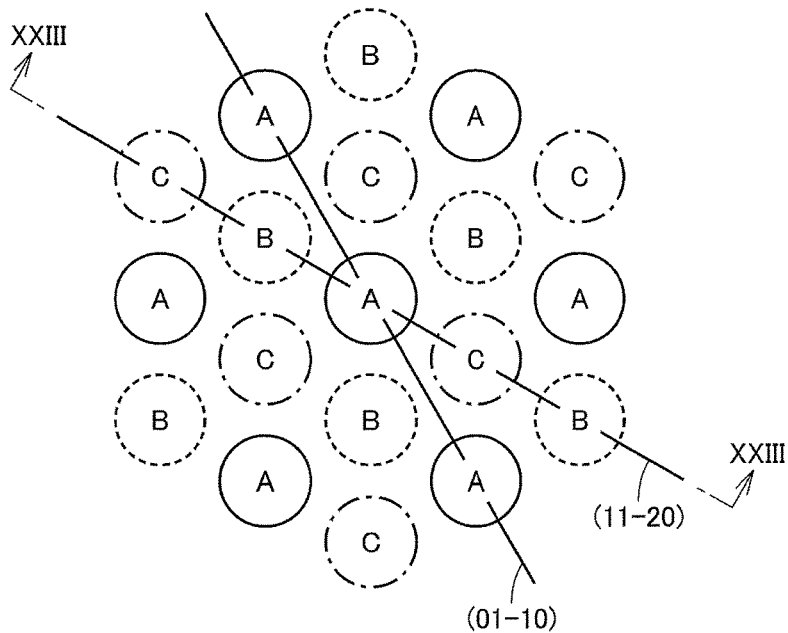
FIG. 22 shows a crystal structure of a (000-1) plane in a hexagonal crystal of polytype 4H.

Generally, regarding Si atoms (or C atoms), when viewing a silicon carbide single crystal of polytype 4H from the (000-1) plane, atoms in a layer A (solid line in the figure), atoms in a layer B (broken line in the figure) disposed therebelow, and atoms in a layer C (chain line in the figure) disposed therebelow, and atoms in a layer B (not shown in the figure) disposed therebelow are repeatedly provided as shown in FIG. 22. In other words, with four layers ABCB being regarded as one period, a periodic stacking structure such as ABCBABCBABCB . . . is provided.

Figure 23:
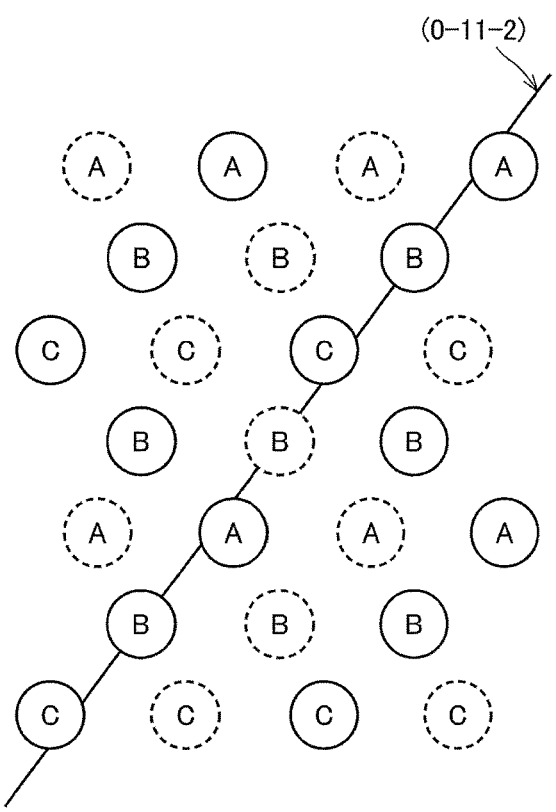
FIG. 23 shows a crystal structure of a (11-20) plane along a line XXIII-XXIII of FIG. 22.

As shown in FIG. 23, in the (11-20) plane (cross section taken along a line XXIII-XXIII of FIG. 22), atoms in each of four layers ABCB constituting the above-described one period are not aligned completely along the (0-11-2) plane. In FIG. 23, the (0-11-2) plane is illustrated to pass through the locations of the atoms in layers B. In this case, it is understood that each of atoms in layers A and C is deviated from the (0-11-2) plane. Hence, even when the macroscopic plane orientation of the surface of the silicon carbide single crystal, i.e., the plane orientation thereof with its atomic level structure being ignored is limited to (0-11-2), this surface can have various structures microscopically.

Figure 24:
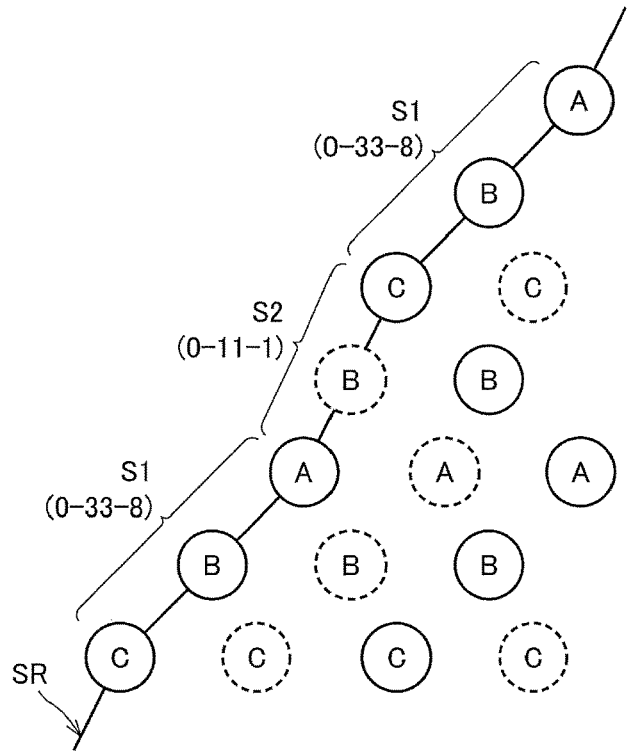
FIG. 24 shows a crystal structure in the vicinity of a surface with a combined plane of FIG. 21 within a (11-20) plane.

As shown in FIG. 24, combined surface SR is constructed by alternately providing planes S1 having a plane orientation of (0-33-8) and planes S2 connected to planes S1 and having a plane orientation different from that of each of planes S1. Each of planes S1 and S2 has a length twice as large as the interatomic spacing of the Si atoms (or C atoms). It should be noted that a plane with plane S1 and plane S2 being averaged corresponds to the (0-11-2) plane (FIG. 23).

Figure 25:
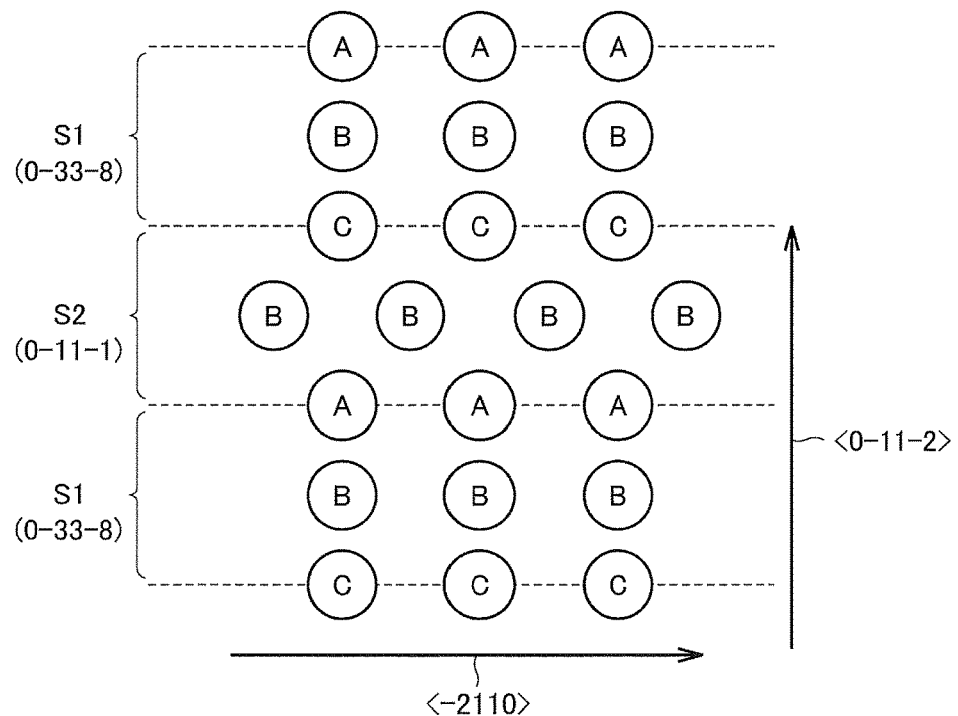
FIG. 25 shows the combined plane of FIG. 21 when viewed from a (01-10) plane.

As shown in FIG. 25, when viewing combined plane SR from the (01-10) plane, the single-crystal structure has a portion periodically including a structure (plane S1 portion) equivalent to a cubic structure. Specifically, combined plane SR is constructed by alternately providing planes S1 having a plane orientation of (001) in the above-described structure equivalent to the cubic structure and planes S2 connected to planes S1 and having a plane orientation different from that of each of planes S1. Also in a polytype other than 4H, the surface can be thus constituted of the planes (planes S1 in FIG. 25) having a plane orientation of (001) in the structure equivalent to the cubic structure and the planes (planes S2 in FIG. 25) connected to the foregoing planes and having a plane orientation different from that of each of the foregoing planes. The polytype may be 6H or 15R, for example.

Figure 26:
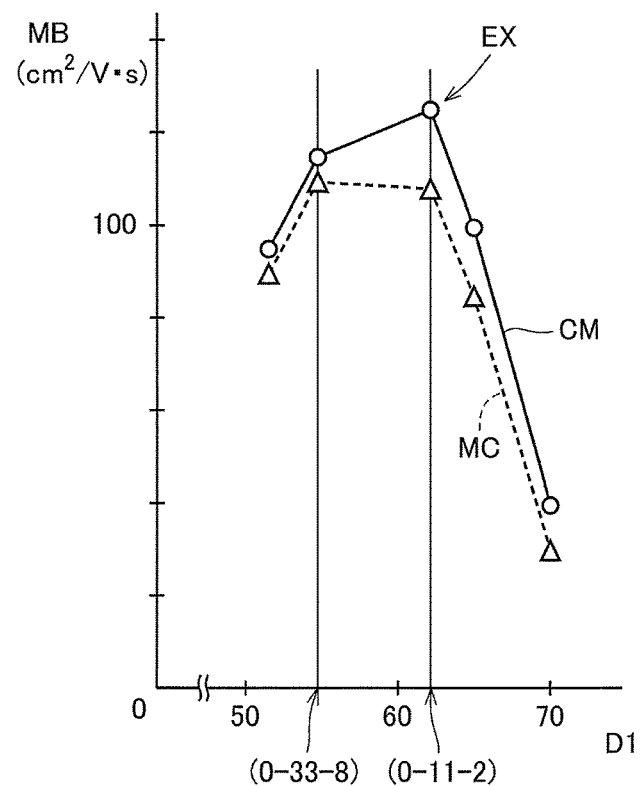
FIG. 26 is a graph showing an exemplary relation between channel mobility and an angle between a channel surface and the (000-1) plane when macroscopically viewed, in each of a case where thermal etching is performed and a case where no thermal etching is performed.

Next, with reference to FIG. 26, the following describes a relation between the crystal plane of side wall surface SW and mobility MB of the channel surface. In the graph of FIG. 26, the horizontal axis represents an angle D1 formed by the (000-1) plane and the macroscopic plane orientation of side wall surface SW having the channel surface, whereas the vertical axis represents mobility MB. A group of plots CM correspond to a case where side wall surface SW is finished to correspond to a special plane by thermal etching, whereas a group of plots MC correspond to a case where side wall surface SW is not thermally etched.

In group of plots MC, mobility MB is at maximum when the channel surface has a macroscopic plane orientation of (0-33-8). This is presumably due to the following reason: in the case where the thermal etching is not performed, i.e., in the case where the microscopic structure of the channel surface is not particularly controlled, the macroscopic plane orientation thereof corresponds to (0-33-8), with the result that a ratio of the microscopic plane orientation of (0-33-8), i.e., the plane orientation of (0-33-8) in consideration of that in atomic level becomes statistically high.

On the other hand, mobility MB in plot group CM is at maximum when the macroscopic plane orientation of the channel surface is (0-11-2) (arrow EX). This is presumably due to the following reason: as shown in FIG. 24 and FIG. 25, the multiplicity of planes S1 each having a plane orientation of (0-33-8) are densely and regularly arranged with planes S2 interposed therebetween, whereby a ratio of the microscopic plane orientation of (0-33-8) becomes high in the channel surface.

Figure 27:
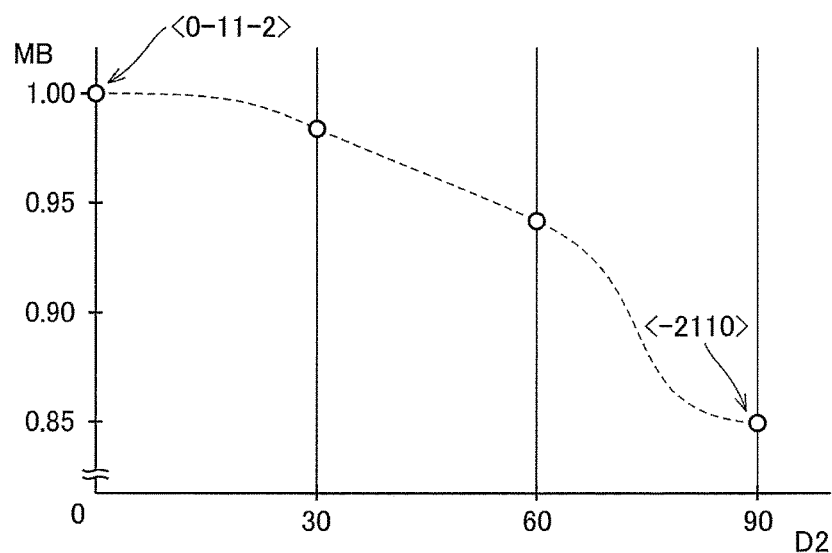
FIG. 27 is a graph showing an exemplary relation between the channel mobility and an angle between a channel direction and a <0-11-2>direction.

It should be noted that mobility MB has orientation dependency on combined plane SR. In a graph shown in FIG. 27, the horizontal axis represents an angle D2 between the channel direction and the <0-11-2>direction, whereas the vertical axis represents mobility MB (in any unit) in the channel surface. A broken line is supplementarily provided therein for viewability of the graph. From this graph, it has been found that in order to increase channel mobility MB, channel direction CD (FIG. 21) preferably has an angle D2 of not less than 0° and not more than 60°, more preferably, substantially 0°.

Figure 28:
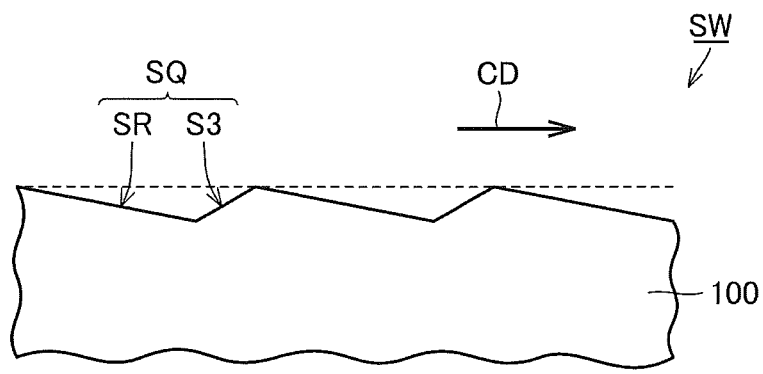
FIG. 28 shows a modification of FIG. 21.

As shown in FIG. 28, side wall surface SW may further include plane S3 (third plane) in addition to combined plane SR. More specifically, side wall surface SW may include a combined plane SQ constituted of periodically repeated plane S3 and combined plane SR. In this case, the off angle of side wall surface SW relative to the {000-1} plane is deviated from the ideal off angle of combined plane SR, i.e., 62°. Preferably, this deviation is small, preferably, in a range of ±10°. Examples of a surface included in such an angle range include a surface having a macroscopic plane orientation of the {0-33-8} plane. More preferably, the off angle of side wall surface SW relative to the (000-1) plane is deviated from the ideal off angle of combined plane SR, i.e., 62°. Preferably, this deviation is small, preferably, in a range of ±10°. Examples of a surface included in such an angle range include a surface having a macroscopic plane orientation of the (0-33-8) plane.

Such a periodic structure can be observed by TEM or AFM, for example.

EXAMPLE

First, MOSFETs according to an Example and a Comparative Example were prepared. Prepared as the MOSFET according to Example was a MOSFET having the structure shown in FIG. 20. Specifically, gate insulating film 200 of the MOSFET according to Example included first insulating film 201 and second insulating film 202 provided partially on first insulating film 201. In other words, the MOSFET according to Example had such a structure that gate insulating film 200 facing side wall surface SW of trench TR is made thick. The other end E2 of second side wall portion 202S of second insulating film 202 is separated from second region 201b and is located on first region 201a. A distance was 0.67 μm from the bottom portion of first insulating film 201 to the other end E2 of second side wall portion 202S of second insulating film 202 in the normal direction of bottom surface BT of trench TR. The thickness of second insulating film 202 was 200 nm. Angle AG (see FIG. 5) of the other end E2 of second insulating film 202 was 67° at the channel portion, and was about 62° on average on the inclined surface. In the MOSFET according to Example, gate insulating film 200 including first insulating film 201 and second insulating film 202 was formed by oxidizing first insulating film 301 and silicon film 302 at 1100° C. for 95 minutes and then oxidizing them at 1350° C. for 3 minutes. Then, silicon carbide substrate 100 having gate insulating film 200 including first insulating film 201 and second insulating film 202 was thermally treated for 28 minutes at a temperature of 1350° C. in a NO atmosphere. Then, silicon carbide substrate 100 having gate insulating film 200 including first insulating film 201 and second insulating film 202 was thermally treated for 40 minutes at a temperature of 1350° C. in an Ar atmosphere.

Gate insulating film 200 of the MOSFET according to Comparative Example was constituted only of first insulating film 201 and did not have second insulating film 202. In other words, the MOSFET according to Comparative Example had such a structure that gate insulating film 200 facing side wall surface SW of trench TR was not made thick. In the MOSFET according to Comparative Example, gate insulating film 200 was formed by oxidizing silicon carbide substrate 100 at 1100° C. for 95 minutes and then oxidizing it at 1350° C. for 6 minutes. Then, silicon carbide substrate 100 having gate insulating film 200 was thermally treated at a temperature of 1350° C. for 7 minutes in a NO atmosphere. Then, silicon carbide substrate 100 having gate insulating film 200 was thermally treated at a temperature of 1350° C. for 10 minutes in an Ar atmosphere.

Figure 29:
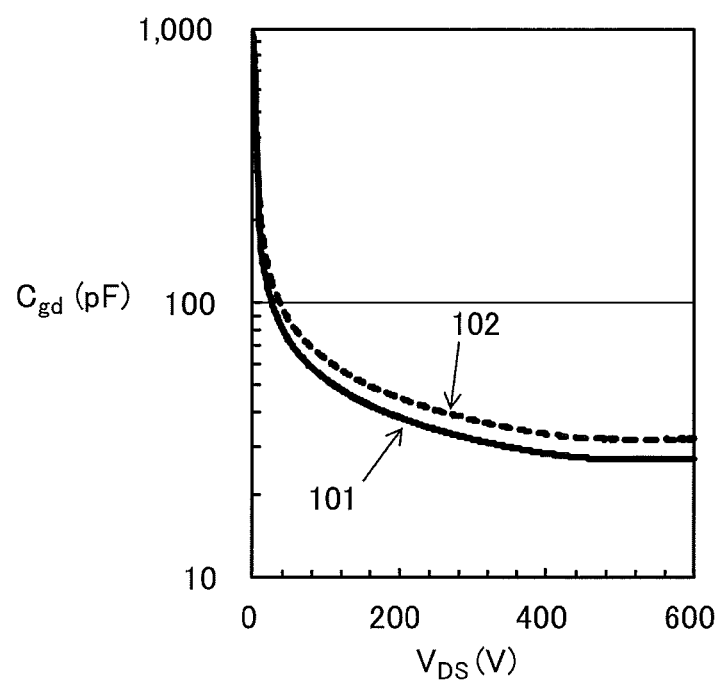
FIG. 29 shows a relation between a capacitance $C_{gd}$ between a gate electrode and a drain electrode and a voltage $V_{DS}$ between the drain electrode and a source electrode.

With reference to FIG. 29, the following describes a relation between a capacitance $C_{gd}$ between gate electrode 230 and drain electrode 211 and a voltage $V_{DS}$ between drain electrode 211 and source electrode 221. In FIG. 29, the capacitance of the MOSFET according to Example is represented by a solid line 101 and the capacitance of the MOSFET according to Comparative Example is represented by a broken line 102.

With reference to FIG. 29, when voltage $V_{DS}$ between drain electrode 211 and source electrode 221 was in the entire range of not less than 0 V and not more than 600 V, capacitance $C_{gd}$ of the MOSFET according to Example was smaller than capacitance $C_{gd}$ of the MOSFET according to Comparative Example. When voltage $V_{DS}$ between drain electrode 211 and source electrode 221 was 600 V, capacitance $C_{gd}$ of the MOSFET according to Example was 32 pF and capacitance $C_{gd}$ of the MOSFET according to Comparative Example was 27 pF. As described above, by providing a thick gate insulating film 200 facing side wall surface SW of trench TR (in other words, by forming second insulating film 202 on first insulating film 201), it was confirmed that capacitance $C_{gd}$ between gate electrode 230 and drain electrode 211 can be reduced effectively.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

100: epitaxial substrate (silicon carbide substrate); 110: single-crystal substrate; 121: n⁻ layer (first semiconductor layer); 122: p type body layer (second semiconductor layer); 123: n region (third semiconductor layer); 124: contact region; 200: gate insulating film; 201: first insulating film; 202: second insulating film; 201B: first bottom portion; 201S: first side wall portion; 201a to 2016c: first to third regions; 202B, 302B: second bottom portion; 202S, 302S: second side wall portion; 203: interlayer insulating film; 211: drain electrode; 212: protecting electrode; 221: source electrode; 222: source interconnection; 230: gate electrode; 302: silicon film; 401: mask; 402: resist layer; 501 to 503: MOSFET (silicon carbide semiconductor device); AG: inclination angle; BT: bottom surface; CH: channel surface; CR: corner portion; DP: depth position; E1: one end; E2: the other end; SW: side wall surface; SW1 to SW3: first to third side surfaces; TR: trench.

The invention claimed is:

1. A method for manufacturing a silicon carbide semiconductor device comprising steps of:

preparing a silicon carbide substrate including a first semiconductor layer, a second semiconductor layer, and a third semiconductor layer, said first semiconductor layer having a first conductivity type, said second semiconductor layer being provided on said first semiconductor layer, said second semiconductor layer having a second conductivity type, said third semiconductor layer being provided on said second semiconductor layer, said third semiconductor layer being separated from said first semiconductor layer by said second semiconductor layer, said third semiconductor layer having said first conductivity type;

forming a trench in said silicon carbide substrate, said trench including a bottom surface and a side wall surface, said bottom surface being constituted of said first semiconductor layer, said side wall surface having first to third side surfaces respectively constituted of said first to third semiconductor layers;

forming a first insulating film to directly cover each of said side wall surface and said bottom surface, said first insulating film having a first bottom portion and a first side wall portion, said first bottom portion being located on said bottom surface, said first side wall portion being located on said side wall surface, said first side wall portion having first to third regions respectively located on said first to third side surfaces;

forming a silicon film on said first insulating film, said silicon film having a second bottom portion and a second side wall portion, said second bottom portion being located on said first bottom portion, said second side wall portion being located on said first side wall portion, said second side wall portion having one end and an other end, said one end being connected to said second bottom portion, the other end being located on one of said first and second regions, the other end being separated from said third region;

forming a second insulating film by oxidizing said silicon film, said first and second insulating films constituting a gate insulating film; and forming a gate electrode on said trench with said gate insulating film being interposed therebetween.

2. The method for manufacturing the silicon carbide semiconductor device according to claim 1, wherein the step of forming said second insulating film by oxidizing said silicon film is performed at not less than 800° C. and not more than 1150° C.

3. The method for manufacturing the silicon carbide semiconductor device according to claim 1, wherein the step of forming said second insulating film includes a step of heating said second side wall portion to reduce an angle of the other end of said second side wall portion relative to said first side wall portion.

4. The method for manufacturing the silicon carbide semiconductor device according to claim 3, wherein the step of heating said second side wall portion is performed at not less than 1300° C. and not more than 1400° C.

* * * * *